United States Patent [19]
Ali

[11] Patent Number: 5,576,146
[45] Date of Patent: Nov. 19, 1996

[54] PHOTOSENSITIVE POLYMER-CONTAINING SYSTEMS WITH INCREASED SHELF-LIVES

[75] Inventor: M. Zaki Ali, Mendota Heights, Minn.

[73] Assignee: Imation Corp., Woodbury, Minn.

[21] Appl. No.: 373,575

[22] Filed: Jan. 17, 1995

[51] Int. Cl.$^6$ .................................................. G03C 1/73
[52] U.S. Cl. ................... 430/286.1; 430/283.1; 430/284.1; 430/287.1; 430/288.1; 430/920; 430/922; 522/63; 522/75; 522/79; 522/116
[58] Field of Search .................... 430/286, 283, 430/284, 287, 288, 920, 922; 522/63, 75, 79, 116

[56] References Cited

U.S. PATENT DOCUMENTS

| | | | |
|---|---|---|---|
| 3,448,089 | 6/1969 | Celeste | 260/78.5 |
| 3,583,950 | 6/1971 | Kollinsky et al. | 260/78 |
| 3,598,790 | 8/1971 | Kollinsky et al. | 260/78.3 |
| 4,111,922 | 9/1978 | Beede et al. | 526/292 |
| 4,199,362 | 4/1980 | Yoshida et al. | 430/218 |
| 4,288,523 | 9/1981 | Taylor | 430/215 |
| 4,304,705 | 12/1981 | Heilmann et al. | 260/30.4 N |
| 4,304,923 | 12/1981 | Rousseau | 560/26 |
| 4,378,411 | 3/1983 | Heilmann et al. | 428/500 |
| 4,451,619 | 5/1984 | Heilmann et al. | 525/379 |
| 4,547,449 | 10/1985 | Alexandrovich et al. | 430/115 |
| 4,647,525 | 3/1987 | Miller | 430/338 |
| 4,737,560 | 4/1988 | Heilmann et al. | 526/304 |
| 4,889,932 | 12/1989 | Miller | 430/338 |
| 4,914,165 | 4/1990 | Klun et al. | 525/528 |
| 5,077,178 | 12/1991 | Hebert et al. | 430/338 |
| 5,235,015 | 8/1993 | Ali et al. | 528/304 |

FOREIGN PATENT DOCUMENTS 0403100  12/1990  European Pat. Off. .

*Primary Examiner*—George F. Lesmes
*Assistant Examiner*—Laura Weiner
*Attorney, Agent, or Firm*—Gregory A. Evearitt; Arlene K. Musser

[57] ABSTRACT

A photosensitive polymer-containing system containing: (a) an energy sensitive polymer having a linear hydrocarbyl backbone and pendant peptide groups with free-radically polymerizable functionality attached thereto; (b) a vinyl-halomethyl-s-triazine capable of free-radical generation upon excitation with electromagnetic radiation having a wavelength of from about 330 to 500 nm; (c) an organic acid having a pKa of from about 1.8 to 5.5; (d) a leuco dye; and (e) a binder. A colorant may optionally be added. The photosensitive systems exhibit an increased shelf-life and excellent photosensitivity.

25 Claims, No Drawings

PHOTOSENSITIVE POLYMER-CONTAINING SYSTEMS WITH INCREASED SHELF-LIVES

FIELD OF THE INVENTION

This invention relates to photosensitive polymer-containing systems having an increased shelf-life. These systems are useful in the graphic arts, particularly as photoresists, printing plates, or proofing films.

BACKGROUND OF THE ART

Imaging systems employing free-radical polymerization to crosslink an energy sensitive composition are well known in the graphic arts and provide, for example, printing plates and photoresists. In order to attain maximum sensitivity, and therefore a higher rate of plate or photoresist production, it is generally necessary to prevent oxygen from inhibiting the polymerization process. This is generally accomplished by the use of a barrier layer topcoat of a material such as polyvinyl alcohol which is relatively impervious to oxygen, the use of an inert or very low pressure atmospheric environment, or the addition of an oxygen scavenger to the energy sensitive composition.

U.S. Pat. No. 4,304,923 discloses printing plate compositions with branched condensation urethane oligomers having both ethylenically unsaturated free-radically polymerizable groups and carboxylic acid groups.

U.S. Pat. No. 3,448,089 describes copolymers suitable for coatings and printing plates containing a plurality of pendant acrylic ester groups and carboxylic acid groups, but they cannot contain peptide groups.

U.S. Pat. Nos. 3,583,950 and 3,598,790 describe copolymers of vinyl azlactones and ethylenically unsaturated monomers. There are no free-radically polymerizable groups in the copolymer.

U.S. Pat. Nos. 4,378,411 and 4,304,705 disclose radiation curable polymers derived from a copolymer of vinyl azlactone having pendant ethylenically unsaturated groups. The polymer does not contain either acid salt groups or quaternary ammonium salt groups attached to it.

U.S. Pat. No. 4,737,560 describes polymer beads derived from polymerization of i) a vinyl azlactone monomer, ii) a water soluble monomer (including acid salt containing monomers), and iii) a cross-linking agent (i.e., a multifunctional free-radically polymerizable monomer). Similarly, U.S. Pat. No. 4,111,922 discloses cross-linked hydrophilic random copolymers derived from quaternary ammonium monomers and ethylenically unsaturated monomers which have improved water absorbency and bacteriostatic properties. In both cases the polymer is an insoluble, uncoatable, cross-linked material and is unsuitable for use in photopolymer imaging.

U.S. Pat. No. 4,451,619 describes a method for modifying the hydrophilicity of alkenyl azlactone derived polymers. The polymers described are not capable of free-radical polymerization crosslinking reactions in that they do not have pendant ethylenically unsaturated groups.

U.S. Pat. No. 4,288,523 describes polymers with pendant acid and peptide groups. In this case the polymer contains no free-radically polymerizable groups.

U.S. Pat. No. 4,914,165 discloses aqueous solvent dispersible, radiation cross-linkable compounds and oligomers containing a polyether backbone and multiple ethylenically unsaturated groups in combination with carboxyl groups. The compounds and oligomers are useful in the graphic arts.

U.S. Pat. No. 4,547,449 discloses liquid electrographic developers which contain an addition copolymer of a quaternary ammonium salt monomer, an acid monomer, and a solubilizing monomer. U.S. Pat. No. 4,199,362 discloses polymer latex compounds derived from copolymerization of acid-containing monomers and ethylenically unsaturated monomers. These compositions do not have free-radically polymerizable pendant groups.

One of the problems encountered with some photosensitive polymer-containing systems is their shelf-lives. Over a period of time of a few days or longer at elevated temperatures or upon natural aging for several months some systems exhibit a significant loss of exposed visible image (EVI), also known in the literature as "printout image", and photospeed. Thus, there is a continued need in the industry for improved photosensitive systems. It was against this background that a search for photosensitive systems with increased shelf-lives and the like was initiated.

SUMMARY OF THE INVENTION

In accordance with the present invention, it has now been discovered that the addition of organic acids having a pKa of about 1.8 to 5.5 to certain photosensitive polymer-containing systems containing photoactive triazines results quite surprisingly in a system with an improved shelf-life. Until the present invention, it was not recognized by those in the art that a shelf-life stability problem with photosensitive systems containing triazines even existed.

Thus, in one embodiment the present invention provides a photosensitive polymer-containing system with a high shelf-life comprising:

(a) an energy sensitive polymer having a linear hydrocarbyl backbone and pendant peptide groups with free-radically polymerizable functionality attached thereto, and additionally at least one organic oxyacid group or salt thereof having the formula (III) disclosed later herein;

(b) a vinyl-halomethyl-s-triazine capable of free-radical generation upon excitation with electromagnetic radiation having a wavelength of from about 330–500 nm;

(c) an organic acid having a pKa of from about 1.8 to 5.5;

(d) a leuco dye; and (e) binder.

In a preferred embodiment, a colorant such as a dye or a pigment is added to the photosensitive system.

In another embodiment, the present invention provides the inventive photosensitive systems coated on substrates suitable for use as printing plates, photoresists, proofing films, and the like.

In the absence of organic acids having a pKa of about 1.8 to 5.5, articles coated with the energy sensitive polymers of formula (III) and triazine of formula (IV) show significant loss of printout image (i.e., EVI)) and photospeed upon accelerated or natural aging as compared to the inventive systems which incorporate the suitable organic acid.

In this application:

"peptide group" means the group

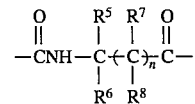

wherein $R^5$, $R^6$, $R^7$, $R^8$ and n are as defined below;

"substantially aqueous" means at least 90 percent by weight water; and

"alkenyl azlactone" means 2-oxazolin-5-one groups of Formula I and 2-oxazin-6-one groups of Formula (II):

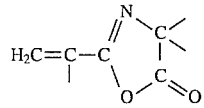  (I)

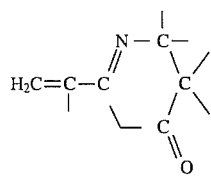  (II)

Other aspects, advantages, and benefits of the present invention are apparent from the detailed description, examples, and claims.

DETAILED DESCRIPTION OF THE INVENTION

The energy sensitive polymers used in the present invention, which may be block or random, preferably random, and which have homo- or copolymeric backbones, are described by formula III:

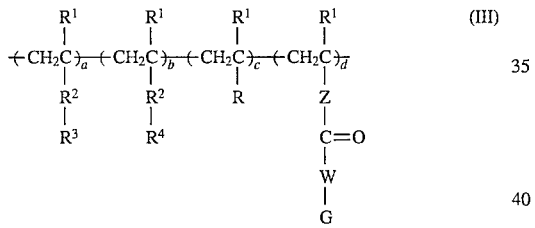  (III)

wherein:

$R^1$ can be hydrogen or methyl;

$R^2$ is represented by:

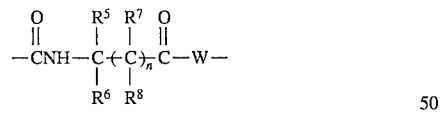

wherein n is 0 or 1; $R^5$, $R^6$, $R^7$, and $R^8$ can be independently an alkyl group having to 12 carbon atoms or a cycloalkyl group having 5 to 12 carbon atoms, an aryl or aralkyl group having 6 to 12 carbon atoms or at least one of the pairs $R^5$ and $R^6$, and $R^7$ and $R^8$, taken together with the carbon to which it is joined forms a 5- or 6-membered carbocyclic ring, or any of $R^5$, $R^6$, $R^7$ and $R^8$ may be H when n is 1; preferably $R^5$ and $R^6$ are methyl and n is 0;

W can be —NH—, $NR^{20}$, —S— or —O—, wherein $R^{20}$ can be alkyl of 1 to 12 carbon atoms; preferably W can be —O— or —NH—; it is most preferred that W is —O—;

Z can represent:

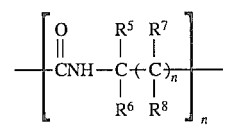

wherein $R^5$, $R^6$, $R^7$, $R^8$, and n are as previously described;

$R^3$ can be a polymerizable, ethylenically unsaturated group selected from;

(a)

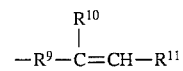

in which $R^9$ can be an alkylene group having 1 to 12 carbon atoms, an arylene group having 6 to 10 carbon atoms, an oxyalkylene group or a poly(oxyalkylene) in which the alkylene group has 2 to 4 carbon atoms and the number of oxygen atoms is a positive integer less than or equal to four, most preferably $R^9$ has from 1 to 4 carbon atoms; $R^{10}$ is hydrogen, cyano, a carboxyl group, or a —C(=O)$NH_2$ group; and $R^{11}$ is hydrogen, an alkyl group having 1 to 12 carbon atoms, or a phenyl group or naphthyl group optionally having substitution thereon which can be, for example, halogen, an alkyl or alkoxy group from 1 to 4 carbon atoms, or (b) -$R^9$-W-T in which $R^9$ is as defined as in (a), W is as previously defined, and T is an ethylenically unsaturated group selected from the group consisting of: acryloyl, methacryloyl, cinnamoyl, maleoyl, fumaroyl, itaconoyl, and crotonoyl, and is preferably acryloyl or methacryloyl;

a, b, c, and d independently are integers, wherein a and b are at least 1, and the sum of a+b+c+d is sufficient to provide a polymer having a number average molecular weight in the range of 2,000 to 1,000,000;

G is given by -$R^9$-$N^+R^{12}R^{13}R^{14}$ $X^-$, wherein $R^9$ is as previously defined and wherein $R^{12}$, $R^{13}$, and $R^{14}$ are independently an alkyl group having 1 to 20 carbon atoms or a cycloalkyl group having 5 to 12 carbon atoms, an aryl or aralkyl group having 6 to 12 carbon atoms or any two or all three of $R^{12}$, $R^{13}$, and $R^{14}$ taken together with the nitrogen to which they are joined can form a 5- to 8-membered heterocyclic ring, and $X^-$ represents any non-interfering anion including anions located elsewhere on the polymeric backbone or side chains. Examples of non-interfering anions are well known in the imaging arts and include, but are not limited to, anions with a unitary negative charge such as chloride, bromide, iodide, alkyl and aryl carboxylates, alkyl and aryl sulfonates, bicarbonate, etc., and anions with a negative charge greater than 1 such as sulfate, phosphate, and the like. Preferred anions are iodide, chloride, and bromide.

R represents an aryl group having from 6 to 30 carbon atoms, cyano, —$CO_2H$, carboalkoxy group having from 2 to 40 carbon atoms, or a mono- or dialkylcarbamoyl group having from 2 to 40 carbon atoms. Preferably R is —$CO_2H$.

$R^4$ represents hydrogen, or a solubilizing cation such as sodium, potassium, or quaternary ammonium, or -E-A wherein E represents a divalent organic connecting group having up to a total of about 18 C, N, S, and nonperoxidic atoms, and A is an acid group selected from carboxyl, sulfo, and phospho groups, and salts thereof. $R^4$ may be multifunctional, having more than one group A. Non-limiting examples of E include alkylene and arylene groups (e.g., propane-1,3-diyl, methylene, dodecane- 1,12-diyl, p-phenylene), oxa-substituted alkylene groups (e.g., 2-oxapropan-1,3-diyl, 3-oxapentan-1,5-diyl), aza-substituted alkylene groups (e.g., 2-azapropan- 1,3-diyl, 3-methyl-3-azapentan-1,5-diyl), and the like. Examples of A include, but are not limited to, carboxy group (—COOH), phospho group (—$PO_3H_2$), and sulfo group (—$SO_3H$) and their salts with alkali metals (e.g., sodium, lithium, potassium), mono-, di-, tri-, and tetra-substituted ammonium salts (e.g., ammonium, tetrabutyl ammonium, phenyldipropylammonium). Preferably, A is a carboxyl group, sulfo group, or phospho group or an alkali metal or tetra substituted ammonium salt thereof.

The energy sensitive polymers used in the present invention are conveniently prepared by free-radically polymerizing an alkenyl azlactone monomer, optionally in the presence of additional free radically polymerizable comonomers, to give a polymer which is subsequently derivatized with functional free-radically polymerizable groups. It is preferred to use 10 to 100 weight percent alkenyl azlactone monomer and 0 to 90 weight percent comonomer, more preferably 50 to 100 weight percent alkenyl azlactone and 50 to 0 weight percent comonomer. This procedure avoids the problem of polymerization of the pendant free-radically polymerizable group during synthesis of the polymer backbone. Vinyldimethylazlactone is commercially available.

2-Alkenylazlactones are well-known and their synthesis, physical and chemical properties, homo- and copolymerization behavior, and preparations and applications are discussed in a recent review by J. K. Rasmussen et al., "Polyazlactones" which is contained in the *Encyclopedia of Polymer Science and Engineering*, Volume 11, 2nd edition (1988) pp. 558–571. Useful 2-alkenyl azlactones for the present invention include 2-vinyl-4,4-dimethyl-2-oxazolin-5-one, 2-isopropenyl-4,4-dimethyl-2-oxazolin-5-one, 2-vinyl-4-ethyl-4-methyl-2-oxazolin-5-one, 2-vinyl-4,4-diethyl-2-oxazolin-5-one, 2-vinyl-4-methyl-4-phenyl-2-oxazolin-5-one, 2-isopropenyl-4,4-tetramethylene-2-oxazolin-5-one, 2-vinyl-4,4-pentamethylene-2-oxazolin-5-one, and 2-vinyl-4,4-dimethyl-2-oxazin-6-one.

Representative comonomers include acrylic acid and methacrylic acid, and monofunctional acrylates and methacrylates, acrylamides and methacrylamides, acrylonitrile and methacrylonitrile, styrene, and N-vinylpyrrolidone. Preferred comonomers include dimethylaminoethyl methacrylate and acrylate, methyl methacrylate, ethyl acrylate, ethylene oxide acrylate, itaconic acid, isooctyl methacrylate, lauryl methacrylate, or salts thereof, preferably quaternary ammonium salts having 4 to 25 carbon atoms, more preferably having 10 to 25 carbon atoms. Examples of preferred quaternary ammonium cations include, but are not limited to, ethyl trimethyl ammonium, tetrabutyl ammonium, hexyltributyl ammonium, tetrahexyl ammonium, methyl tribenzyl ammonium, benzyl trimethyl ammonium, and the like. The anion can be any solubilizing anion.

Polymerization of the polymer backbone to provide a homopolymer or a copolymer may be accomplished by either thermal (for example through the decomposition of acyl peroxides, dialkyl percarbonates, azoalkanes, etc.) or photochemical (such as photolysis of bisimidazoles, benzoin ethers, aromatic ketones, halomethyl-s-triazines, sensitized iodonium or sulfonium salts, etc.) means well known in the art. Thermal initiation is preferred.

While the polymers used in the present invention can have a linear hydrocarbyl backbone and pendant peptide groups with free radically polymerizable functionality attached thereto, and additionally organooxy acid residue groups, it is generally preferred that additional quaternary ammonium groups are present, as mentioned above. In many instances increases in adhesion to metals such as treated aluminum substrates is observed upon inclusion of these groups in the polymer. The quaternary ammonium salt groups may be incorporated into the polymer either by copolymerization of a quaternary ammonium salt containing monomer, or by reaction with the formed polymer via a coupling reaction (such as coupling through an azlactone group with a nucleophile substituted quaternary ammonium salt), or by quaternization of a tertiary amine bound to the polymer.

The energy sensitive polymer is present in an amount of from about 30 to 80 weight percent, and preferably from about 40 to 55 weight percent, based upon the weight of the dried, coated photosensitive system.

The chromophore-substituted vinyl-halomethyl-s-triazine compounds used in the present invention are preferably represented by the formula

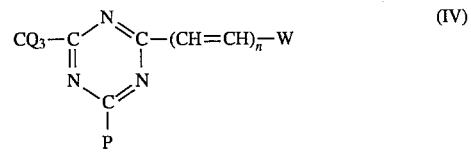

(IV)

wherein: Q is bromine or chlorine, P is —$CQ_3$, —$NH_2$, —NHR, —$NR_2$, or —OR where R is phenyl or lower alkyl ("lower alkyl" herein meaning an alkyl group having no more than 6 carbon atoms); n is an integer from 1 to 3; and W is an optionally substituted aromatic or heterocyclic nucleus or

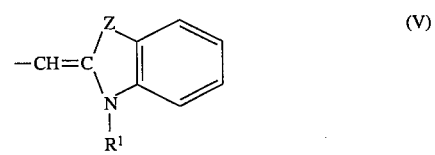

(V)

wherein: Z is oxygen or sulfur and $R^1$ is hydrogen, a lower alkyl or phenyl group. Where W is an aromatic or heterocyclic nucleus, the ring may be optionally substituted. Without attempting an exhaustive listing of substituents, the following are noted as typical: chloro, bromo, phenyl, lower alkyl, nitro, phenoxy, alkoxy, acetoxy, acetyl, amino, and alkyl amino.

The s-triazine compounds as described above generate free radicals when irradiated with actinic radiation of a wavelength from about 330 to about 500 nm, preferably from about 350–450 nm, and most preferably at wavelengths of 365 and 410 nm. Such triazines are well known to those of ordinary skill in the art and are disclosed in U.S. Pat. No. 3,954,475. Suitable sources of radiation include, but are not limited to, mercury, xenon, carbon arc and tungsten filament lamps, lasers, sunlight, etc. Exposures may be from less than about 1 microsecond to 10 minutes or more depending upon the amounts of energy sensitive polymer and triazine being utilized and depending upon the radiation source and distance from the source and thickness of the coating to be cured. Electron beam may also be used. The triazine compound is used in an amount of from about 0.5 to 15.0 percent by weight, and preferably from about 3.0 to 10.0 weight percent, of the solids content of the coated and dried photosensitive polymer-containing system.

The leuco dyes used in the present invention may be any colorless or lightly colored compound that forms a visible dye upon oxidation. The compound must be oxidizable to a colored state. Compounds that are both pH sensitive and oxidizable to a colored state are useful, but not preferred, while compounds only sensitive to changes in pH are not included within the term "leuco dyes" since they are not oxidizable to a colored form.

The dyes generated by the leuco compounds employed in the present invention are known and are disclosed, for example, in The Colour Index; The Society of Dyes and Colourists: Yorkshire, England, 1971; Vol. 4, p. 4380; and Venkataraman, K. *The Chemistry of Synthetic Dyes*; Academic Press: New York, 952; Vol. 2, p. 714.

Preferred leuco dyes are triarylmethane leuco dyes and are well known in the art.

The leuco compounds employed in the present invention may readily be synthesized by techniques known in the art.

Any organic acid which has a pKa from about 1.8 to 5.5; preferably, from about 2.0 to 5.0; and more preferably, from about 2.5–3.5 may be used in the present invention. Examples of such organic include phthalic acid (o-phthalic acid), m-phthalic acid, p-phthalic acid, lactic acid, oxalic acid, o-hydroxybenzoic acid, succinic acid, and o-chlorobenzoic acid. The most preferred organic acid is phthalic acid. The amount of organic acid used in the present invention is generally in the range of from about 0.5 to 6.0 weight percent, and preferably, from about 1.0 to 3.0 weight percent, based upon the solids content of the coated and dried photosensitive polymer-containing system.

Any natural or synthetic aqueous solvent-soluble (or even nonaqueous solvent-soluble preferably in amounts up to about 20 percent by weight) polymeric binder may be used in the practice of this invention. Organic polymeric resins may be used. Thermoplastic resins are generally preferred. Examples of suitable binders are sulfonated polystyrene, polyvinyl alcohol, starch, polymethyl methacrylate, polyvinyl acetate, and the like. Beyond these minimal requirements, there is no criticality in the selection of a binder. In fact, even transparency or translucency are not required although they are desirable. A generally useful range is up to 30 percent by weight binder, preferably 2 to 15 percent of binder by weight based upon the solids content of the coated and dried photosensitive polymer-containing system.

Pigments or dyes may be used as colorants in the present invention; however, pigments are preferred since they provide more light-stable colored images. The pigments are generally introduced into the photosensitive formulation in the form of a millbase comprising the pigment dispersed with a binder and suspended into a solvent or mixture of solvents. Many different pigments are available and are well known in the art. The pigment type and color are chosen so that the coated colored element is matched to a preset color target or specification set by the industry.

The photosensitive polymer-containing systems used in the present invention are prepared by dissolving the energy sensitive polymers of formula (III), in a suitable solvent to a concentration of about 1 to 20%, preferably about 5 to 10% by weight. When the formula (III) polymers have been prepared in a solvent, it may be necessary only to add additional solvent to reach the desired concentration. Examples of solvents that can be used include acetone, methyl ethyl ketone, methanol, ethanol, n-propanol, isopropanol, ethyl acetate, benzene, toluene, trichloroethylene and the like. Preferred solvents are the aqueous alcohols and methyl ethyl ketone. The triazine, leuco dye, organic acid, binder, and colorant (if used) are also added to the solvent system.

The dried coating weight of the photosensitive polymer-containing system of the present invention is usually 0.3 to 9 g/m², preferably 0.5 to 5 g/m², and most preferably 0.8 to 2.4 g/m². The photosensitive systems of the present invention are normally coated by means known in the art onto a substrate for use in various imaging applictions. Substrates may be transparent or opaque. Suitable substrates on which the photosensitive systems of the present invention may be supported include, but are not limited to, metals (for example, steel, and aluminum plates including aluminum treated with hydrophilizing agents such as silicates or poly-acrylic acid and its derivatives, sheets, and foils); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), and poly(hexamethylene adipamide/adipate)). Aluminum is a preferred substrate. Grained, anodized, and silicated aluminum is particularly preferred. The coated substrates are maintained in the absence of light unless the element is sensitized to a narrow range of the electromagnetic spectrum outside the range of normal light and the element is provided with a filter layer which excludes normal visible light.

It is within the scope of the invention, when modification of polymer properties is desired, to include up to 20 parts of a copolymerizable ethylenically unsaturated multifunctional monomer and oligomer per part of polymers of formula (III) by weight in the photosensitive systems. Preferred monomers that can be used are multifunctional acrylates and methacrylates such as neopentylglycol diacrylate, 1,6-hexanediol diacrylate, pentaerythritol triacrylate and tetraacrylate, 1,3,5-tri(2-acryloyloxyethyl)isocyanurate, and the corresponding methacrylates.

Preferred oligomers that can used include polyester acrylates and methacrylates, urethance acrylates and methacrylates, epoxy acrylates and methacrylates and the like. These oligomers are commercially available and have a molecular weight of above about 600 and less than 2000.

The preferred utility of the photosensitive polymer-containing systems of the present invention is as a presensitized plate for use in printing operations such as in the formation of lithographic plates. This structure comprises a grained, anodized, and silicated aluminum substrate coated with from 0.3 to 9 g/m² of the photosensitive systems (excluding solvent) of the present invention. Grained substrates are surfaces which have been textured or roughened. This treatment is well known in the an and can be effected by brush graining (roughening with an abrasive material), chemical etching, or electrochemical graining. Anodizing is the well known anodic oxidation of metal surfaces. Silication is also well known in the art to hydrophilize the substrate.

Objects and advantages of this invention are further illustrated by the following examples, but the particular materials and amounts thereof recited in these examples, as well as other conditions and details, should not be construed to unduly limit this invention.

EXAMPLES

Formulation (C) discloses photosensitive systems without any added acid. Formulations (A) and (B) disclose photosensitive systems with added acids, both organic and inorganic. The photosensitive systems were coated onto electrochemically grained, anodized, and silicated aluminum substrates. The coating weight was 150 mg/ft². The dried coated plates were then exposed through a 21 step, step wedge negative in a vacuum exposure frame having a 5 kW diazo bulb emitting light at a wavelength of 350–450 nm. The exposed plates were then processed using a developer containing of 1% $NaHCO_3$, 2% Pelex NBL sodium butylnaphthalenesulfonate, 0.2% $Na_3$-EDTA and 96.8% water. The processing was done by a machine or by hand using a brush for mechanical action. Results of the aging study (140° F. for 3–7 days) are shown in Table I.

The term "solid step" as used below refers to the highest numbered step on a $\sqrt{2}$ wedge which is completely covered by material following development as judged by the unaided eye. Higher solid steps at fixed exposure conditions correlate with higher photosensitivity (i.e., speed).

Formulation (A)

The following photopolymer composition was prepared, which contained o-phthalic acid (3% of solids):
1. ECHO-345 trimethacrylated novolac epoxide (50% in MEK) 75 g
2. Azlactone Reactive Polymer (ARP) (34.75% in MEK) 294.06 g (Disclosed at column 10, lines 50–70, in U.S. Pat. No. 5,235,015, incorporated herein by reference)
3. CAB-500-5 cellulose acetate butyrate (10% in MEK) 3.75 g
4. MEK 2046.82 g
5. p-MOSTOL (see U.S. Pat. No. 4,476,215, column 6, line 2) 15.0 g
6. Leuco compound (structure shown below) 4.69 g
7. Irganox 1010 hindered phenol (available from Ciba-Geigy) 2.25 g
8. o-phthalic acid 5.63 g
9. FC-430 fluorochemical surfactant (1% in MEK) (available from 2.5 g 3M Company)
10. Cyan Millbase (32.8%) (1/1 pigment/binder) 50.3 g Formulation (B)

A photosensitive system as in formulation (A) was prepared, except that the solution contained 3.75 g of o-phthalic acid (2% of solids) instead of 5.63 g of phthalic acid.

Formulation (C)

A photosensitive system was prepared as in formulation (A), except that no phthalic acid, or acid of any type, was present.

The structure of the leuco compound used in Formulations (A)–(C) is as shown below. This compound was prepared via a condensation reaction between p-demethylamino benzaldehyde and N,N-dimethyl-m-toluidine, using known synthetic procedures for the synthesis of triarylmethane leuco compounds.

TABLE 1

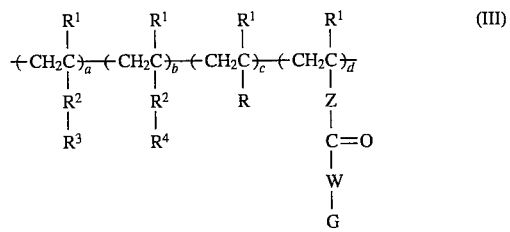

| Ex. | Formulation | EVI Fresh | EVI 3d | EVI 7d | EVI Loss (days) | Solid Step Fresh | Solid Step 3d | Solid Step 7d |
|---|---|---|---|---|---|---|---|---|
| 1 | (A), PA 3% | .22 | .20 | .14 | 36 (7d) | 5 | 6.5 | 9 |
| 2 | (B), PA 2% | .23 | .18 | .13 | 43 (7d) | 5 | 7 | 8 |
| 3 | (C), No acid | .27 | .16 | .05 | 81 (7d) | 5 | 5 | 4.5 |
| 4 | (A), PA 3% | .28 | .26 | 18 | 35 (7d) | 5 | 5 | 5 |
| 5 | (B), PA 2% | .28 | .25 | .15 | 46 (7d) | 4 | 5 | 4 |
| 6 | (C), No acid | .32 | .22 | .09 | 71 (7d) | 4.5 | 3 | 0 |

Note: Examples 1–3, exposures 23 units (about 23 seconds), machine processed; Examples 4–6, exposures 45 units (about 45 seconds) and hand processed. PA=Phthalic acid, (d)=days at 140° F. EVI (exposed visible image) refers to the image density of the exposed area as measured by a densitometer with an appropriate color filter. EVI is the difference between density of the exposed area and the non-exposed area.

From the results as shown in Table I, it is clear that the addition of organic acid significantly improves the shelf-life of the printing plates. The biggest improvement was seen when the plates were aged for 7 days at 140° F. and then processed by hand (Examples 4 and 5). For the plate containing no acids (Examples 3 and 6), the average loss of EVI (exposed visible image) was 76% compared to an average loss of only 35.5% for the plates with 3% phthalic acid (Examples 1 and 4). Similarly, the plates that did not contain any added acid (Examples 3 and 6), showed results ranging from reduction of photospeed to complete loss of image (upon processing) after 7 days at 140° F., whereas the plates containing 3% of phthalic acid (Examples 1 and 4) did not show any loss of photospeed after 7 days at 140° F.

Reasonable variations and modifications are possible from the foregoing disclosure without departing from either the spirit or scope of the present invention.

What is claimed is:

1. A photosensitive polymer-containing system comprising:

(a) an energy sensitive polymer having the formula:

$$+CH_2C)_a^{R^1}+CH_2C)_b^{R^1}+CH_2C)_c^{R^1}+CH_2C)_d^{R^1} \quad \text{(III)}$$
$$\begin{array}{cccc} R^2 & R^2 & R & Z \\ | & | & | & | \\ R^3 & R^4 & & C=O \\ & & & | \\ & & & W \\ & & & | \\ & & & G \end{array}$$

wherein:

$R^1$ independently is hydrogen or methyl;

$^2$ is given by:

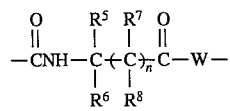

wherein:

n is 0 or 1; $R^5$, $R^6$, $R^7$, and $R^8$ are independently an alkyl group having 1 to 12 carbon atoms or a cycloalkyl group having 5 to 12 carbon atoms, an aryl or aralkyl group having 6 to 12 carbon atoms or at least one of the pairs $R^5$ and $R^6$, and $R^7$ and $R^8$, taken together with the carbon to which it is joined forms a 5- or 6-membered carbocyclic ring, or any of $R^5$, $R^6$, $R^7$ and $R^8$ may be H when n is 1;

W is —NH—, $NR^{20}$, —S— or —O—, wherein $R^{20}$ can be alkyl of 1 to 12 carbon atoms; and Z represents

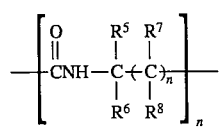

wherein $R^5$, $R^6$, $R^7$, $R^8$, and n are as previously defined; $R^3$ is a polymerizable, ethylenically unsaturated group selected from;

(a)

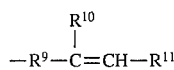

in which $R^9$ can be an alkylene group having 1 to 12 carbon atoms, an arylene group having 6 to 10 carbon atoms, an oxyalkylene group or a poly(oxyalkylene) in which said alkylene group has 2 to 4 carbon atoms and the number of oxygen atoms is a positive integer less than or equal to four, $R^{10}$ is hydrogen, cyano, a carboxyl group, or a —C(=O)NH$_2$ group; and $R^{11}$ is hydrogen, an alkyl group having 1 to 12 carbon atoms, or a phenyl group or naphthyl group; or (b) -$R^9$-W-T in which $R^9$ is as defined as in (a), W is as previously defined, and T is an ethylenically unsaturated group selected from the group consisting of: acryloyl, methacryloyl, cinnamoyl, maleoyl, fumaroyl, itaconoyl, and crotonoyl; and a, b, c, and d independently are integers, wherein a and b are at least 1, and the sum of a+b+c+d is sufficient to provide a polymer having a number average molecular weight in the range of 2,000 to 1,000,000;

G is given by -$R^9$-N+$R^{12}R^{13}R^{14}$X-, wherein $R^9$ is as previously defined and wherein $R^{12}$–$R^{14}$ are independently an alkyl group having 1 to 20 carbon atoms or a cycloalkyl group having 5 to 12 carbon atoms, an aryl or aralkyl group having 6 to 12 carbon atoms or any two or all three of $R^{12}$–$R^{14}$ taken together with the nitrogen to which they are joined can form a 5- to 8-membered heterocyclic ring, and X$^-$ represents any non-interfering anion including anions located elsewhere on the polymeric backbone or side chains;

R represents an aryl group having from 6 to 30 carbon atoms, cyano, —CO$_2$H, a carboalkoxy group having from 2 to 40 carbon atoms, or a mono- or dialkylcarbamoyl group having from 2 to 40 carbon atoms; and $R^4$ represents hydrogen, or a solubilizing cation or -E-A wherein E represents an organic divalent connecting group having up to a total of about 18 C, N, S, and nonperoxidic atoms, and A is an acid selected from carboxylic acids, sulfonic acids, phosphonic acids and salts thereof;

(b) a vinyl-halomethyl-s-triazine capable of free-radical generation upon excitation with electromagnetic radiation having a wavelength of from about 330–500 nm;

(c) an organic carboxylic acid having a pKa of from about 1.8 to 5.5;

(d) a leuco dye; and (e) a binder.

2. The photosensitive system according to claim 1 wherein $R^1$ is H, and $R^5$ and $R^6$ are methyl, and n is 0.

3. The photosensitive system according to claim 1 wherein said energy sensitive polymer has a homopolymeric backbone.

4. The photosensitive system according to claim 1 wherein said enery sensitive polymer has a copolymeric backbone.

5. The photosensitive system according to claim 1 wherein the A group of $R^4$ is an alkali metal or a tetrasubstituted ammonium salt of a carboxyl, sulfo, or phospho group.

6. The photosensitive system according to claim 1 wherein the A group of $R^4$ is PO$_3$H$_2$, SO$_3$H, or CO$_2$H.

7. The photosensitive system according to claim 1 wherein R is —COOH.

8. The photosensitive system according to claim 1 wherein the energy sensitive polymer is derived from an alkenylzalactone monomer.

9. The photosensitive system according to claim 1 wherein the energy sensitive polymer is derived from an alkenylazlactone monomer and at least one additional free-radically polymerizable comonomer.

10. The photosensitive system according to claim 9 wherein said comonomer is a diacid.

11. The photosensitive system according to claim 9 wherein said alkenylazlactone is present in said energy sensitive polymer in the range of 10 to 100 weight percent and said at least one comonomer is present in said energy sensitive polymer in the range of more than 0 to 90 weight percent.

12. The photosensitive system according to claim 1 wherein said energy sensitive polymer has a number average molecular weight in the range of 2,000 to 1,000,000.

13. The photosensitive system according to claim 1 wherein said triazine has the following formula:

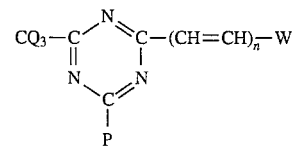

wherein: Q is bromine or chlorine, P is —CO$_3$, —NH$_2$, —NHR, —NR$^2$ or —OR where R is phenyl or lower alkyl, n is an integer from 1 to 3 and W is an optionally substituted phenyl, pyrryl, benzopyrl, oxazoyl, benzoxazoyl, benzthiazoyl or

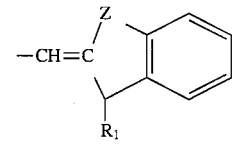

where Z is oxygen or sulfur and $R_1$ is hydrogen, a lower alkyl or a phenyl group.

14. The photosensitive system according to claim 13 wherein Q is —Cl and P is —CCl$_3$.

15. The photosensitive system according to claim 1 wherein said organic acid has a pKa of from about 2.0 to 5.0.

16. The photosensitive system according to claim 1 wherein said organic acid has a pKa of from about 2.5 to 3.5.

17. The photosensitive system according to claim 1 wherein said acid is o-phthalic acid.

18. The photosensitive system according to claim 1 wherein said leuco dye is a triaryl methane leuco compound.

19. The photosensitive system according to claim 18 wherein said leuco dye has the following structure:

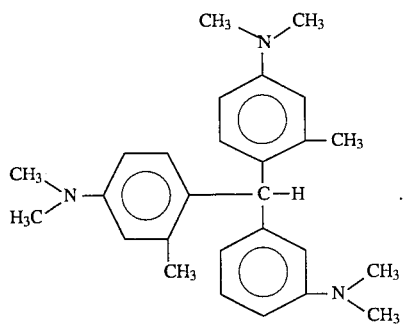

20. The photosenstive system according to claim 1 further comprising colorant.

21. A substrate comprising the dried, coated photosensitive polymer-containing system of claim 1.

22. A substrate comprising the dried, coated photosensitive polymer-containing system of claim 13.

23. A substrate comprising the dried coated photosensitive polymer containing system of claim 15.

24. A substrate comprising the dried, coated photosensitive polymer containing system of claim 16.

25. A substrate comprising the dried, coated photosensitive polymer containing system of claim 17.

* * * * *